United States Patent
Hsiao et al.

(10) Patent No.: US 7,789,717 B2
(45) Date of Patent: Sep. 7, 2010

(54) ELECTRICAL CONNECTOR

(75) Inventors: Shih-Wei Hsiao, Tu-Cheng (TW); Wen-Yi Hsieh, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/502,775

(22) Filed: Jul. 14, 2009

(65) Prior Publication Data

US 2010/0009557 A1 Jan. 14, 2010

(30) Foreign Application Priority Data

Jul. 14, 2008 (TW) .............................. 97126592 A

(51) Int. Cl.
*H01R 13/514* (2006.01)
(52) U.S. Cl. ..................................... 439/752
(58) Field of Classification Search ................. 439/752, 439/71, 70
See application file for complete search history.

(56) References Cited

U.S. PATENT DOCUMENTS

| | | | | |
|---|---|---|---|---|
| 5,299,958 | A * | 4/1994 | Ohsumi ...................... | 439/752 |
| 5,662,501 | A * | 9/1997 | Yagi et al. ................... | 439/752 |
| 7,097,463 | B2 * | 8/2006 | Hsiao et al. .................. | 439/70 |
| 7,666,000 | B1 * | 2/2010 | Hsiao et al. .................. | 439/66 |
| 2009/0140759 | A1 * | 6/2009 | Hsiao et al. ................. | 324/755 |
| 2009/0224782 | A1 * | 9/2009 | Chen et al. .................. | 324/754 |

FOREIGN PATENT DOCUMENTS

CN 200620073583.1 8/2007

* cited by examiner

*Primary Examiner*—Phuong K Dinh
(74) *Attorney, Agent, or Firm*—Andrew C. Cheng; Wei Te Chung; Ming Chieh Chang

(57) ABSTRACT

An electrical connector (100) for receiving a central process unit comprises: a first insulative housing (14) defining a number of receiving channels (141) extending along a first direction; a second insulative housing (13) located above the first insulative housing and defining a number of passageways (131) aligned to corresponding receiving channels; a third insulative housing (15) located below the first insulative housing and defining a number of holes (151) extending therethrough and aligned to corresponding passageways; and a number of thin, elongated contacts (11) received in the first, the second and the third insulative housing. Each thin, elongated contact has a contact portion (111) positioned above a top surface of the second insulative housing, a tail portion (112) extending through the holes of the third insulative housing, and a base portion (115) retained in the first and the second insulative housing. The second insulative housing is capable of moving along a second direction above the first housing and each passageway defines an inner sidewall. The base portion of the thin, elongated contact abuts against the inner sidewall of the passageway of the second insulative housing. The contacts can be maintained by the housings to prevent from rotating.

11 Claims, 4 Drawing Sheets

ELECTRICAL CONNECTOR

BACKGROUND OF THE INVENTION

1. Field of the Invention

The present invention generally relates to an electrical connector, and more particularly to an electrical connector with structure for maintaining contacts.

2. Description of Prior Art

A plurality of contacts arranged in matrix need to be maintained in the insulative housing to prevent the contacts from sliding.

Chinese patent No. 200620073583.1 discloses a socket having an elongated, thin contact received in housing. When a complementary connector mates to the socket, the contacts might rotate along a vertical axis as the contacts are pressed. Therefore, the contacts might not be in the right positions. That is, a reliable electrical and mechanical connection could not be assured. It will be even worse, when the contacts are densely arranged.

Hence, it is desirable to have an improved electrical connector to overcome the above-mentioned disadvantages of the prior art.

BRIEF SUMMARY OF THE INVENTION

Accordingly, the object of the present invention is to provide an electrical connector for maintaining the contacts.

In order to achieve the above-mentioned object, an electrical connector for receiving a central process unit comprises: a first insulative housing defining a plurality of receiving channels extending along a first direction; a second insulative housing located above the first insulative housing and defining a plurality of passageways aligned to corresponding receiving channels; a third insulative housing located below the first insulative housing and defining a plurality of holes extending therethrough and aligned to corresponding passageways; and a plurality of thin, elongated contacts received in the first, the second and the third insulative housing. Each thin, elongated contact has a contact portion positioned above a top surface of the second insulative housing, a tail portion extending through the holes of the third insulative housing, and a base portion retained in the first and the second insulative housing. The second insulative housing is capable of moving along a second direction above the first housing and each passageway defines an inner sidewall. The base portion of the thin, elongated contact abuts against the inner sidewall of the passageway of the second insulative housing. The contacts can be maintained by the housings to prevent from rotating.

Other objects, advantages and novel features of the invention will become more apparent from the following detailed description of the present embodiment when taken in conjunction with the accompanying drawings.

DETAILED DESCRIPTION OF THE INVENTION

Figure 1:
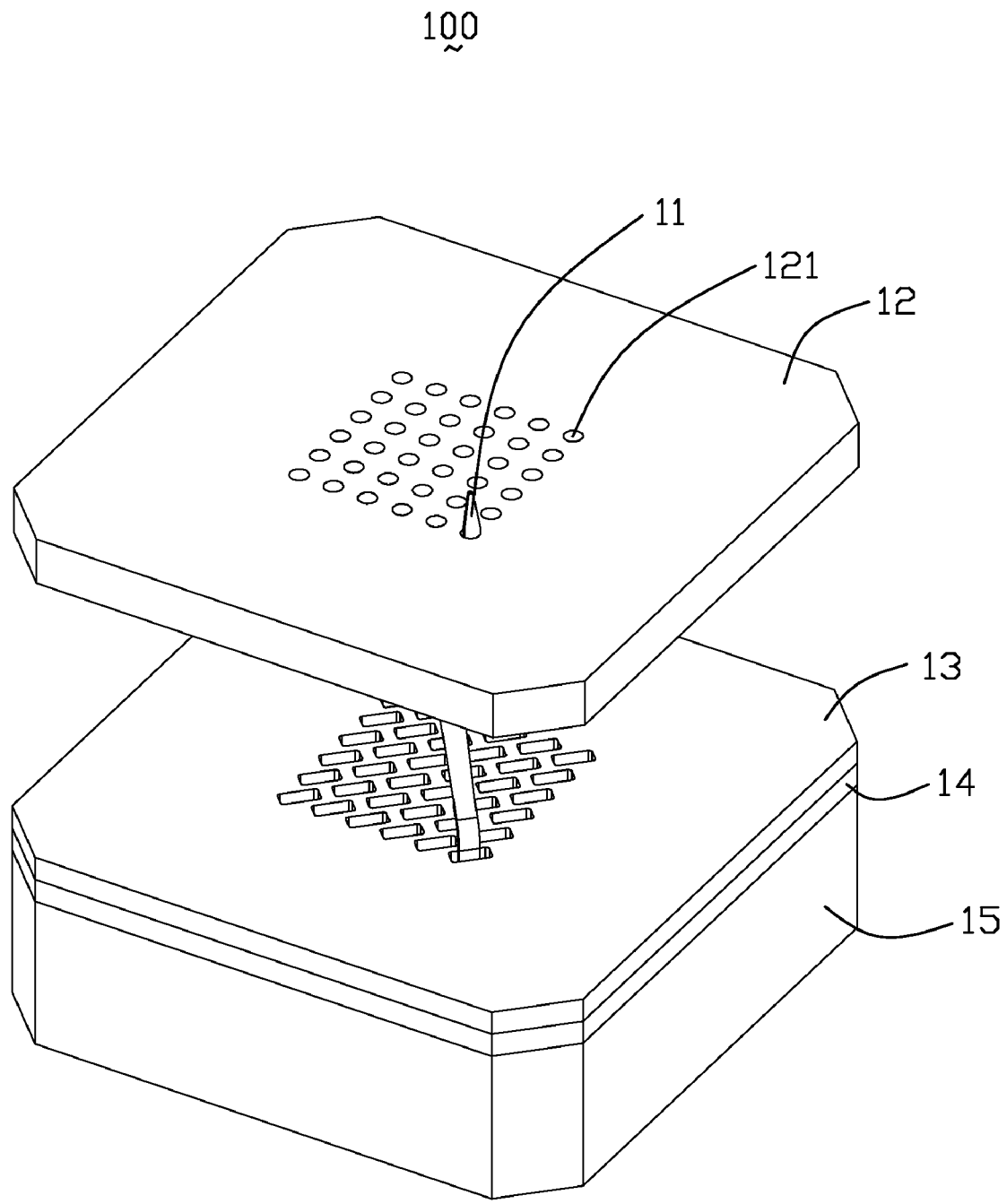
FIG. 1 is a perspective view of an electrical connector in accordance with the present invention.

Reference will now be made with the drawing figures to describe the present invention in detail.

Figure 4:
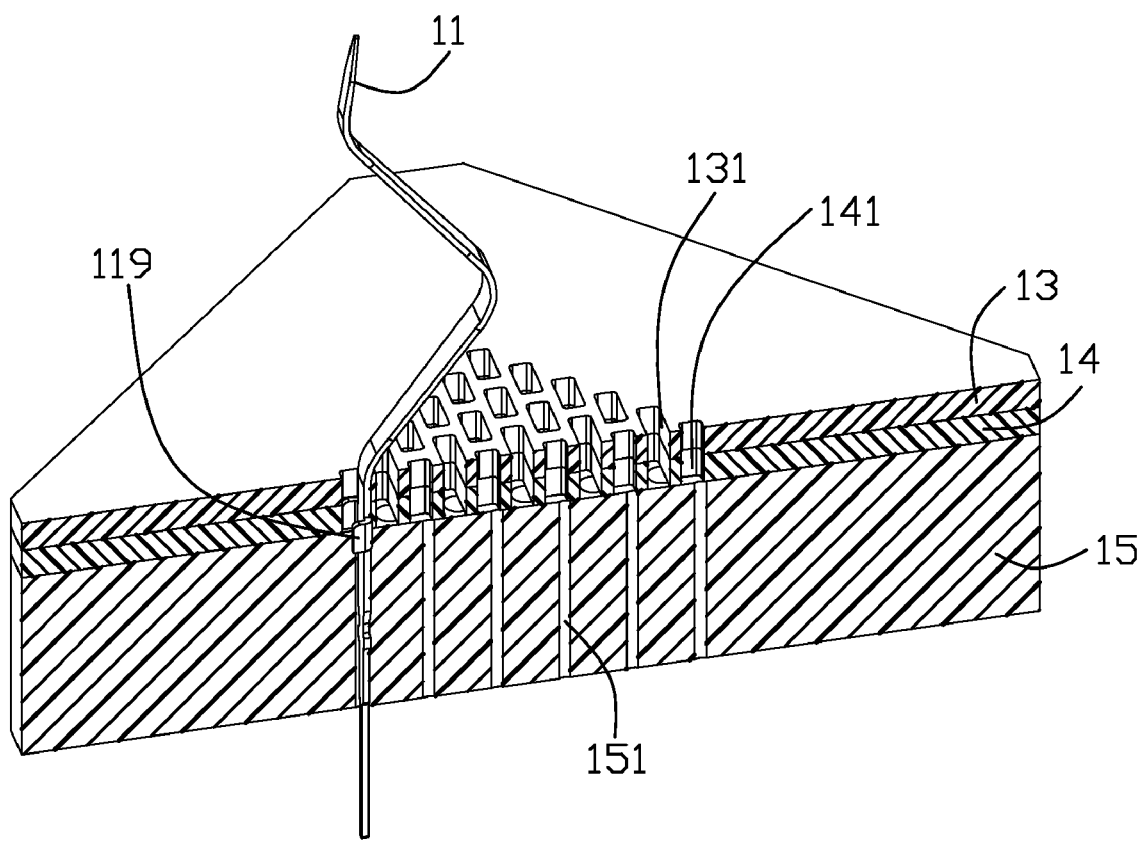
FIG. 4 is a section, perspective view of the electrical connector shown in FIG. 3 along line A-A.

Referring to FIG. 1 and FIG. 4, an electrical connector 100 in accordance with the present invention comprises a plurality of contacts 11, an adapt plate 12, a second insulative housing 13, a first housing 14 and a third insulative housing 15. The contact 11 threads through the adapt plate 12, the second insulative housing 13, the first housing 14 and the third insulative housing 15 from top to bottom.

Figure 2:
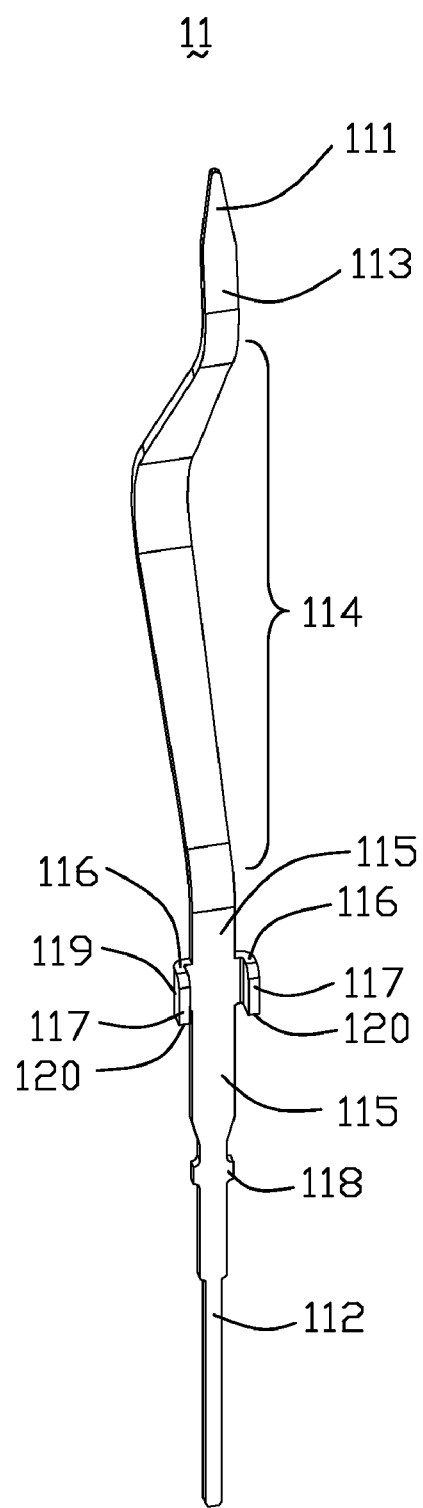
FIG. 2 is a perspective view of a contact in accordance with the present invention.

Referring to FIG. 2, from top to bottom, each contact 11 comprises a contact portion 111, an adapt portion 113, a spring portion 114, a base portion 115, an interference portion 118, and a tail portion 112. The interference portion 118 fixes the contact to the third insulative housing 15 by interference. The base portion 115 has same width, and two arm portions 119 with same length extend from two sides of the base portion 115 parallel and form an U shape with the base portion 115. The arm portion 119 has a top surface 116, a bottom surface 120 and an end surface 117 for connecting the top surface 116 and the bottom surface 120.

Referring to FIG. 1, the adapt plate 12 has a plurality of adapt holes 121, the adapt portion 113 receives in the adapt hole 121. The spring portion 113 is restricted by the adapt hole 121, so the contact portion 111 and the adapt portion 113 can only slide alone the vertical direction to prevent the contact portion 111 from deflecting as the contacts 11 mating with the electrical component.

Figure 3:
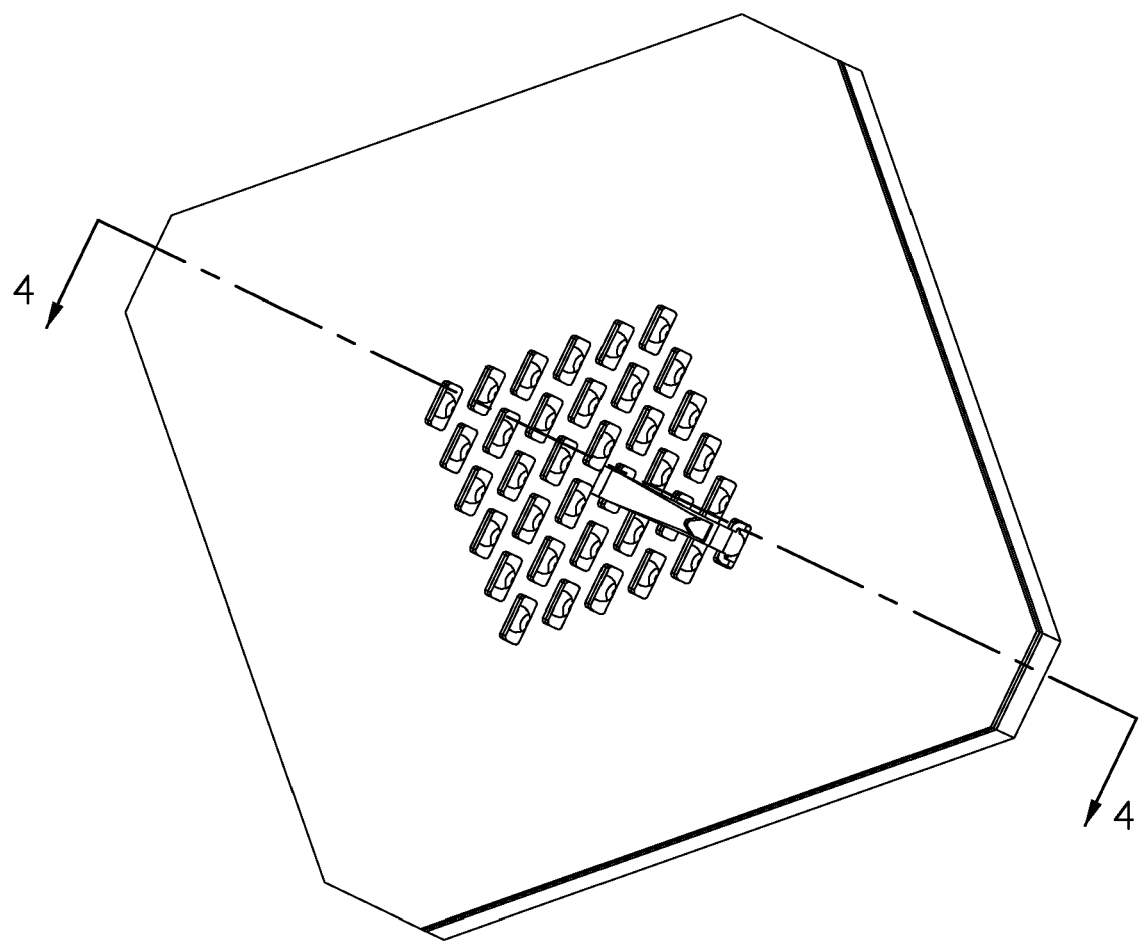
FIG. 3 is another perspective view of the electrical connector shown in FIG. 1 in accordance with the present invention.

Referring to FIG. 2-4, the second insulative housing 13 sets on the upside of the first housing 14, and formed a plurality of passageway 131 with rectangular shape approximately for passing through the contacts 11. The bottom surface of the second insulative housing 13 touches the top surfaces 116 of the arm portions 119.

The first housing 14 has receiving channels 141 with rectangular shape approximately to receive the arm portions 119 of the contacts 11, and the receiving channels 141 maintain the arm portions 119 and the base portion 115 of the contacts 11 to prevent the contacts 11 from rotating. The height of the first housing 14 is same as the arm portion 119 generally.

The third insulative housing 15 has a plurality of circular retaining holes 151 for interference fitting the interference portion 118 of the contact 11. The bottom surface 120 of the arm portion 119 support on the top surface of the retaining holes 151 to avoid the contact move downward.

Referring to FIG. 1-4, the receiving channels 141 of the first housing 14 are one to one correspondence with the passageways 131 of the second insulative housing 13. As the first housing 14 and the second insulative housing 13 not move relatively, major part of the receiving channels 141 and the passageways 131 are superposed, the contacts 11 can thread through the passageway 131 of the second insulative housing 13 to receive in the receiving channels 141 of the first housing 14; after the contacts 11 fixed to the preset position, slide the second insulative housing 13 to cover the top surface 116 of the arm portions 119 for prevent the contacts 11 from moving upward; after the second insulative housing 13 moved in the preset position, the inner side walls of the passageway 131 and the receiving channel 141 sustain on the two surfaces of the flat shaped base portion 115 of the contact 11 which being punched by a metal plate to prevent the contacts 11 from rotating.

What is claimed is:

1. An electrical connector for receiving a central process unit comprising:

a first insulative housing defining a plurality of receiving channels extending along a first direction;

a second insulative housing located above the first insulative housing and defining a plurality of passageways aligned to corresponding receiving channels;

a third insulative housing located below the first insulative housing and defining a plurality of holes extending therethrough and aligned to corresponding passageways; and a plurality of thin, elongated contacts received in the first, the second and the third insulative housing; wherein each thin, elongated contact has a contact portion positioned above a top surface of the second insulative housing, a tail portion extending through the holes of the third insulative housing, and a base portion retained in the first and the second insulative housing; wherein the second insulative housing is capable of moving along a second direction above the first housing and each passageway defines an inner sidewall; and wherein the base portion of the thin, elongated contact abuts against the inner sidewall of the passageway of the second insulative housing, wherein the contact has a base portion, two arm portions extending from two sides of the base portion and forming a top surface and a bottom surface, wherein the base portion and the arm portions are U shaped.

2. The electrical connector as claimed in claim 1, wherein the first direction is perpendicular to the second direction.

3. The electrical connector as claimed in claim 1, wherein the third insulative housing has a plurality of retaining holes for mating with the interference portion of the contact.

4. The electrical connector as claimed in claim 1, wherein a width of the base portion of the contact is same.

5. The electrical connector as claimed in claim 1, further comprising an adapt plate with a plurality of adapt holes, and each contact has an adapt portion received in the adapt holes to make the contact slide along the vertical direction only.

6. The electrical connector as claimed in claim 1, wherein the second insulative housing slides relative to the first housing, and wherein the inner side walls of the passageway and the receiving channel sustain on the two sides of the flat shaped base portion of the contact.

7. The electrical connector as claimed in claim 1, wherein a height of the first housing is same as the arm portion.

8. An electrical connector comprising:

a lower housing including:

a first housing unit defining a plurality of receiving channels vertically extending therethough;

a second housing unit positioned upon the first housing unit and defining a plurality of passageways in vertical alignment with the corresponding receiving channels, respectively; and a third housing unit positioned under the first housing unit and defining a plurality of retaining holes in vertical alignment with the corresponding receiving channels, respectively; and a plurality of contacts each having a curved middle compressible section above the lower housing, and a lower mounting section positioned below the middle compressible section and downwardly extending through the corresponding passageway, receiving channel and retaining hole; wherein the second housing unit is horizontally moveable relative to the first housing unit so as to downwardly press the lower mounting section and block upward movement of said lower mounting section under condition that said contact is downwardly assembled to the lower housing, wherein said lower mounting section is equipped with at least one arm upwardly blocked by the second housing unit, wherein the passageway is dimensioned to be not smaller than that of the arm so as to allow the mounting section of said contact to be assembled into the third housing unit.

9. The electrical connector as claimed in claim 8, wherein said first housing unit and said third housing unit are not uniformed together but being discrete from each other in an intimately stacked manner.

10. The electrical connector as claimed in claim 8, wherein the second housing applies a force upon the lower mounting section of each of the contact in a first horizontal direction.

11. The electrical connector as claimed in claim 8, wherein the first housing unit imposes another force upon the lower mounting section of each of the contacts in a second horizontal direction opposite to said first horizontal direction.

\* \* \* \* \*